United States Patent [19]
Starman

[11] Patent Number: 6,079,259
[45] Date of Patent: Jun. 27, 2000

[54] APPARATUS AND METHOD FOR A DIAGNOSTIC CHECK OF THE ELECTRICAL WIRING OF AN INTERNAL COMBUSTION ENGINE ELECTRONIC UNIT INJECTOR SYSTEM

[75] Inventor: Stephen M. Starman, Pekin, Ill.

[73] Assignee: Caterpillar, Inc., Peoria, Ill.

[21] Appl. No.: 09/072,893

[22] Filed: May 5, 1998

[51] Int. Cl.$^7$ .................................................. G01F 25/00
[52] U.S. Cl. .......................................... 73/118.1; 73/117.2
[58] Field of Search .................................... 324/503, 555, 324/556; 73/118.1, 117.2, 116

[56] References Cited

U.S. PATENT DOCUMENTS

| | | | |
|---|---|---|---|
| 4,028,620 | 6/1977 | Kitagawa et al. | 324/51 |
| 4,835,478 | 5/1989 | Haddon et al. | 324/536 |
| 5,247,245 | 9/1993 | Nelson | 324/556 |
| 5,250,909 | 10/1993 | Bitts | 324/542 |
| 5,264,796 | 11/1993 | Klassen et al. | 324/503 |
| 5,268,644 | 12/1993 | Klassen et al. | 324/503 |
| 5,363,045 | 11/1994 | Martin et al. | 324/395 |
| 5,530,360 | 6/1996 | Kerchaert et al. | 324/503 |

*Primary Examiner*—Max Noori
*Assistant Examiner*—Maurice Stevens
*Attorney, Agent, or Firm*—R. Carl Wilbur

[57] ABSTRACT

An electronic unit injector cross-wire detection system for an internal combustion engine including at least two pairs of electronic unit injectors includes a test signal generating device and a signal receiving device. The test signal generating device includes a signal high line and a signal low line, the signal high line connected to a first wiring harness connection location of each pair of electronic unit injectors of the engine for delivering test signals to a first electronic unit injector of each pair of injectors. The signal low line is connected to a second wiring harness connection location of each pair of electronic unit injectors for returning the delivered test signals. The signal receiving device includes at least two pickup coils, a pickup coil holding structure, and a signal monitoring unit. The two pickup coils are held in a predetermined spaced relationship by the pickup coil holding structure such that each pickup coil is positioned adjacent to a respective predetermined portion of a cover of the engine, each respective predetermined portion of the engine cover being proximate to the first electronic unit injector of a respective pair of electronic unit injectors enclosed within the engine cover. The signal monitoring unit is connected to each of the pickup coils and includes an output device corresponding to each pickup coil for producing an output indicative of whether a given pair of electronic unit injectors is cross-wired.

16 Claims, 5 Drawing Sheets

Fig_2_

Fig_3

APPARATUS AND METHOD FOR A DIAGNOSTIC CHECK OF THE ELECTRICAL WIRING OF AN INTERNAL COMBUSTION ENGINE ELECTRONIC UNIT INJECTOR SYSTEM

TECHNICAL FIELD

This invention relates generally to internal combustion engines of the type including electronic unit injector systems, and more particularly, to an apparatus and method for detecting cross-wiring between electronic unit injectors of the system so as to enable appropriate rewiring when necessary.

BACKGROUND ART

An internal combustion engine such as an in-line cylinder engine typically includes a wiring harness connected to each of the electronic unit injectors for delivering fuel injection control signals thereto. In some cases it is possible that adjacent electronic unit injectors may be accidentally cross-wired during assembly, meaning that the wiring of the two injectors becomes reversed. The electronic unit injectors are enclosed within an engine cover or housing after assembly making it difficult to visually inspect the wiring of the electronic unit injectors. If an engine having cross-wired electronic unit injectors is operated a potential for damage to the engine exists.

Accordingly, the present invention is directed to overcoming one or more of the problems as set forth above.

DISCLOSURE OF THE INVENTION

In one aspect of the present invention a diagnostic system for detecting cross-wiring between first and second electronic unit injectors of an internal combustion engine is provided. The engine includes a wiring harness having a connector which includes a first interface point identified for delivering signals to the first electronic unit injector, a second interface point identified for delivering signals to the second electronic unit injector, a third interface point identified for providing a return path for signals delivered to the first electronic unit injector, and a fourth interface point identified for providing a return path for signals delivered to the second electronic unit injector. The first and second electronic unit injectors are enclosed within a cover of the engine and the wiring harness connector is accessible from the exterior of the engine cover. The diagnostic system for such engine includes a signal generator, a connector, a pickup coil, and a signal receiving unit. The signal generator includes a signal high line and a signal low line. The connector is configured for mating with the wiring harness connector and includes a first predetermined interface point for mating with the first interface point of the wiring harness connector, a second predetermined interface point for mating with the second interface point of the wiring harness connector, a third predetermined interface point for mating with the third interface point of the wiring harness connector, and a fourth predetermined interface point for mating with the fourth interface point of the wiring harness connector. The signal high line of the signal generator is electrically connected to the first predetermined interface point of the connector, and the signal low line of the signal generator is electrically connected to at least the third predetermined interface point of the connector. The pickup coil is adapted for placement adjacent to the engine cover in a region associated with the first electronic unit injector. The signal receiving unit is electrically connected to the pickup coil for receiving signals therefrom and includes a comparator portion and an output device. The comparator portion includes an output connected to control the output device such that the output device produces a visible output when a parameter of a signal received from the pickup coil exceeds a threshold level.

In another aspect of the present invention an electronic unit injector cross-wire detection system for an internal combustion engine including at least two pairs of electronic unit injectors is provided, where each pair of electronic unit injectors includes a respective first electronic unit injector and a respective second electronic unit injector, each of the electronic unit injectors enclosed within a cover of the engine at respective predetermined positions. The engine includes a wiring harness, and the wiring harness includes, for each pair of electronic unit injectors, a first connection location and a second connection location, each first connection location identified for delivering signals to the first electronic unit injector of the given pair and each second connection location identified for returning signals delivered to the first electronic unit injector of the given pair. Each of the first and second wiring harness connection locations are accessible from the exterior of the engine cover. The cross-wire detection system includes a test signal generating device and a signal receiving device. The test signal generating device includes a signal high line and a signal low line, the signal high line connected to the first wiring harness connection location of each pair of electronic unit injectors, and the signal low line connected to the second wiring harness connection location of each pair of electronic unit injectors. The signal receiving device includes at least two pickup coils, a pickup coil holding structure, and a signal monitoring unit. The two pickup coils are held in a predetermined spaced relationship by the pickup coil holding structure such that each pickup coil is positioned adjacent to a respective predetermined portion of the engine cover, each respective predetermined portion of the engine cover being proximate to the first electronic unit injector of a respective pair of electronic unit injectors enclosed within the engine cover. The signal monitoring unit is connected to each of the pickup coils.

In still another aspect of the present invention a method for determining whether an electronic unit injector enclosed within a non-ferrous metal cover of an internal combustion engine is properly connected to a wiring harness is provided, where the wiring harness includes a predetermined connection point identified for delivering signals to the electronic unit injector, the predetermined connection point is accessible from the exterior of the non-ferrous metal cover, and a predetermined location of the exterior of the non-ferrous metal cover is proximate to the electronic unit injector enclosed therein. The method involves connecting a signal generator to the predetermined connection point of the wiring harness and placing a pickup coil adjacent to the predetermined location of the non-ferrous metal cover. A low frequency test signal is applied to the predetermined connection point of the wiring harness via the signal generator and the pickup coil is monitored to determine if a signal indicative of the electronic unit injector being properly connected to the wiring harness is induced in the pickup coil. An output indicator is produced if a signal indicative of the electronic unit injector being properly connected to the wiring harness is induced in the pickup coil.

BRIEF DESCRIPTION OF THE DRAWINGS

For a better understanding of the present invention, reference may be made to the accompanying drawings in which.

BEST MODE FOR CARRYING OUT THE INVENTION

Figure 1:
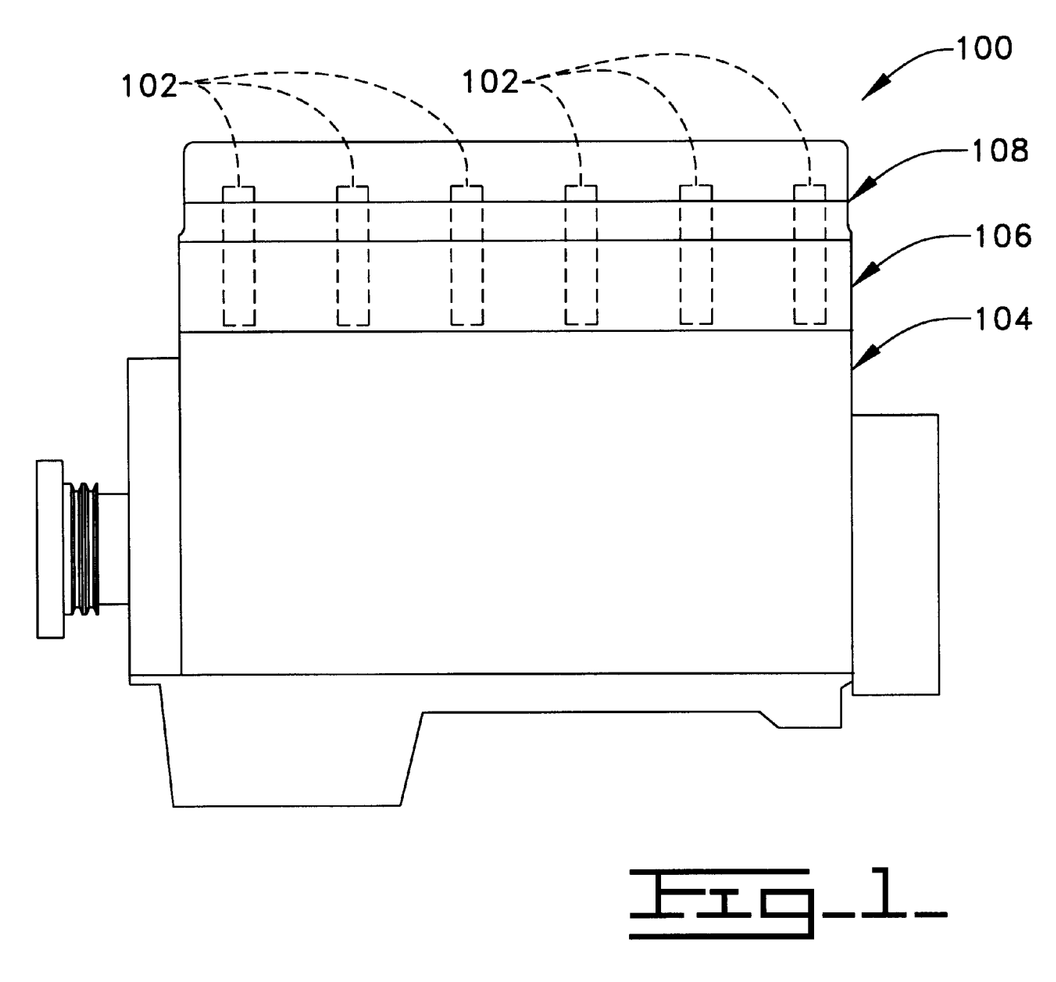
FIG. 1 is a side view of an in-line six cylinder internal combustion engine.

Referring now to the drawings, FIG. 1 depicts a side view of an in-line type six cylinder internal combustion engine 100 including six associated electronic unit injectors (EUIs) 102. Engine 100 includes an engine block 104 atop of which is positioned a cylinder head 106. Each EUI 102 is positioned within cylinder head 106 for injecting fuel into a respective cylinder (not shown) located in engine block 104. One or more engine valve covers or housings 108 are positioned atop cylinder head 106, enclosing each EUI 102 therein. By way of example, engine 100 may be a Caterpillar, Inc. 3406E diesel truck engine.

Figure 2:
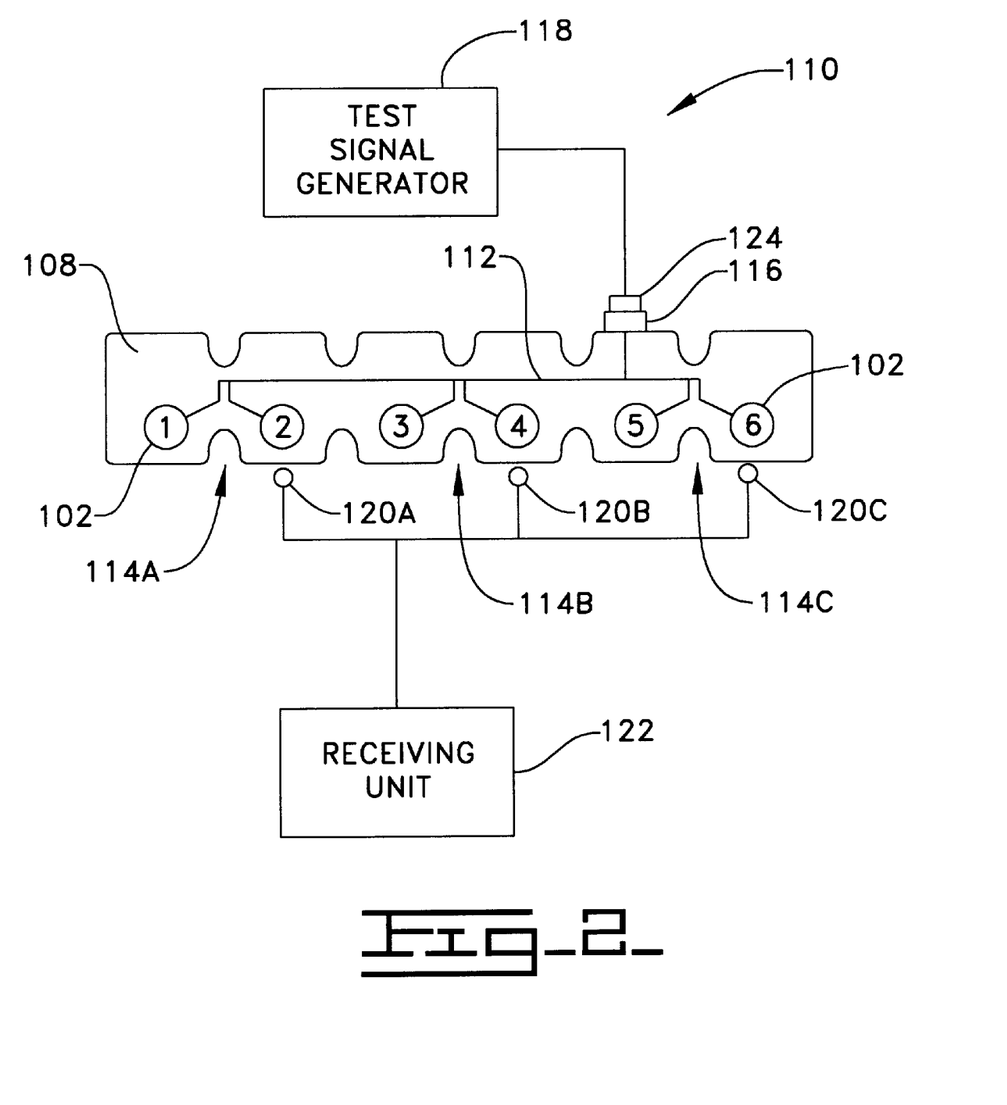
FIG. 2 is a schematic illustration of a diagnostic system in accordance with one embodiment of the present invention, including a test signal generating device and a signal receiving device.

FIG. 2 depicts a schematic view of a diagnostic system 110 in accordance with the present invention. A top view of engine valve cover 108 is shown with EUIs 102 therein, each EUI 102 shown schematically and including a numeric identifier referencing the cylinder with which it is associated. Each EUI 102 is connected to a wiring harness 112 of the engine for enabling control signals to be delivered thereto. In the particular engine 100 shown, the wiring for adjacent EUIs 102 breaks out from wiring harness 112 at the same location. Thus, the EUIs 102 for cylinders 1 and 2 are considered a pair 114A, the EUIs 102 for cylinder 3 and 4 are considered a pair 114B, and the EUIs 102 for cylinders 5 and 6 are considered a pair 114C. Wiring harness 112 includes an externally accessible connector 116, such as a 40 pin DEUTSCH connector for example, which connector 116 includes interface points or connection locations identified for delivering signals to and returning signals from each EUI 102 as will be described in greater detail below.

As mentioned above, it is possible that the EUIs 102 of one or more pairs 114A, 114B, 114C can become cross-wired during assembly. Once engine valve cover 108 is in place it is not possible to visually inspect the wiring. Accordingly, system 110 includes a test signal generator 118, a pickup coil 120A, 120B, 120C for each respective pair 114A, 114B, 114C of EUIs 102, and a signal receiving unit 122.

Test signal generator 118 is connected to predetermined interface points or connection locations of wiring harness connector 116. In particular, referring to FIG. 3, test signal generator 118 may be an RF signal generator such as a Progressive Electronics, Inc. Model No. 500LP. Signal generator 118 is connected to a connector 124 which is configured for mating with wiring harness connector 116, the two connectors being depicted schematically aside each other. As previously mentioned, wiring harness connector 116 includes interface points or connection locations identified for each EUI 102. For example, in the illustrated embodiment wiring harness connector pin 11 is identified for delivering signals to the EUI 102 associated with cylinder 1 and pin 5 is identified for returning such signals; pin 12 is identified for delivering signals to the EUI 102 associated with cylinder 2 and pin 6 is identified for returning such signals; pin 21 is identified for delivering signals to the EUI 102 associated with cylinder 3 and pin 17 is identified for returning such signals; pin 22 is identified for delivering signals to the EUI 102 associated with cylinder 4 and pin 18 is identified for returning such signals; pin 33 is identified for delivering signals to the EUI 102 associated with cylinder 5 and pin 27 is identified for returning such signals; and pin 34 is identified for delivering signals to the EUI 102 associated with cylinder 6 and pin 28 is identified for returning such signals. With respect to the pins or other interface points or connection locations of wiring harness 112, the terminology "identified" for delivering signals to or returning signals from a particular EUI 102 refers to the intended connection configuration in a properly wired engine. In an engine in which the electronic unit injectors of a pair such as pair 114A of FIG. 2 have been cross-wired, pin 12 of wiring harness connector 116 is still considered to be identified for delivering signals to the EUI 102 associated with cylinder 2 even though pin 12 would actually be connected to the EUI 102 associated with cylinder 1 as a result of the cross-wiring.

Figure 3:
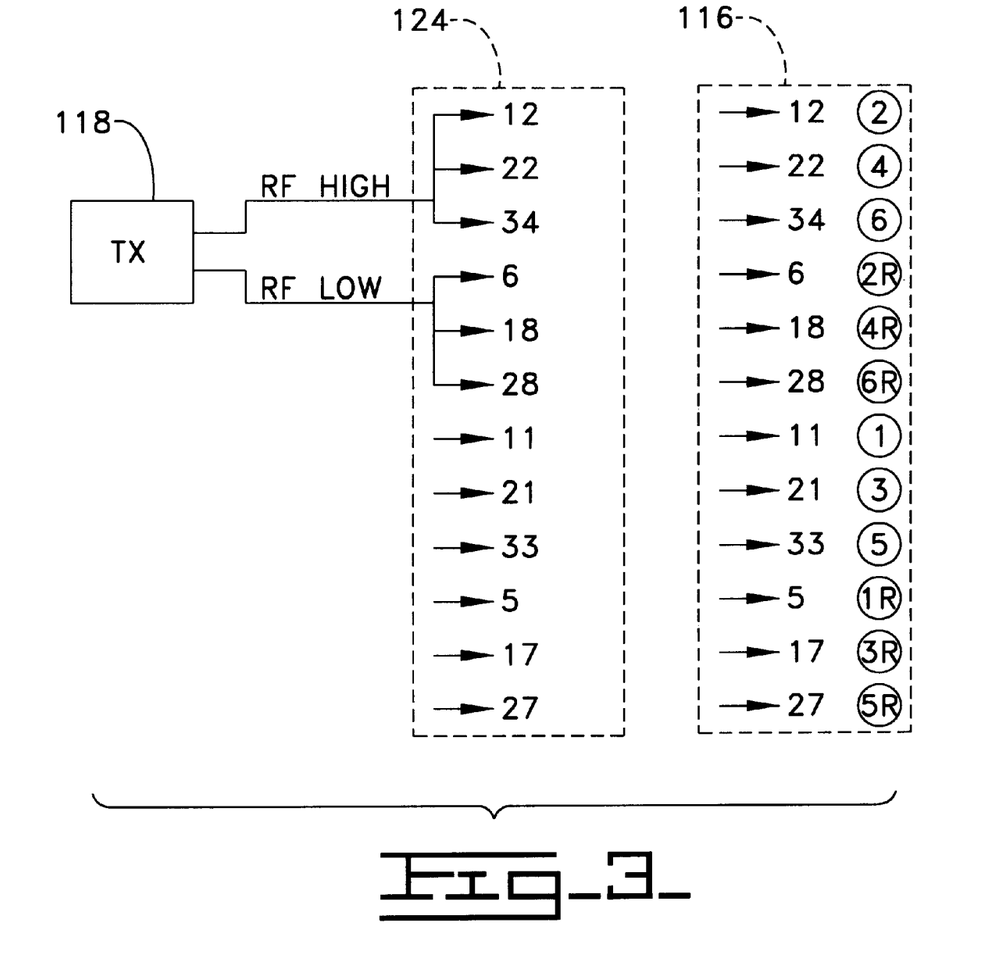
FIG. 3 is a schematic illustration of the test signal generating device of FIG. 2.

Test signal generator 118 includes a signal high line connected to pin 12, pin 22, and pin 34 of connector 124, and also includes a signal low line connected to at least pins 6, 18, and 28 of connector 124. In this manner, when connector 124 is mated with wiring harness connector 116 signals can be delivered to the EUI of cylinder 2, the EUI of cylinder 4, and the EUI of cylinder 6, assuming that the engine wiring is correct.

Referring again to FIG. 2, pickup coils 120A, 120B, and 120C are positioned adjacent engine valve cover 108 at respective predetermined locations, each predetermined location being proximate to one EUI 102 of a respective pair 114A, 114B, 114C. Such predetermined locations may be alongside engine valve cover 108 as shown or could possibly be atop engine valve cover 108 depending upon the engine valve cover configuration and the position of each EUI 102 therein. As used herein the terminology "adjacent" as applied to the positioning of pickup coils 120A, 120B, 120C covers placing such pickup coils in contact with engine valve cover 108 and placing such pickup coils in a non-contacting position with respect to engine valve cover 108. As shown, each pickup coil 120A, 120B, 120C is connected to signal receiving unit 122 which monitors any signals induced therein. For example, if a test signal is applied from signal generator 118 to pin 12 of connector 124, in a properly wired engine such signal will be delivered through wiring harness 112 to the EUI of cylinder 2. In such case, a signal should be induced in pickup coil 120A positioned adjacent engine valve cover in the region of the EUI 102 of cylinder 2. On the other hand, in an engine where injector pair 114A is cross-wired, the signal intended to be delivered to the EUI 102 of cylinder 2 will actually be delivered to the EUI 102 of cylinder 1. Because pickup coil 120A is positioned in the region of the EUI of cylinder 2 rather than cylinder 1, the signal induced in pickup coil 120A by the delivered test signal will be small or non-existent.

Figure 4:
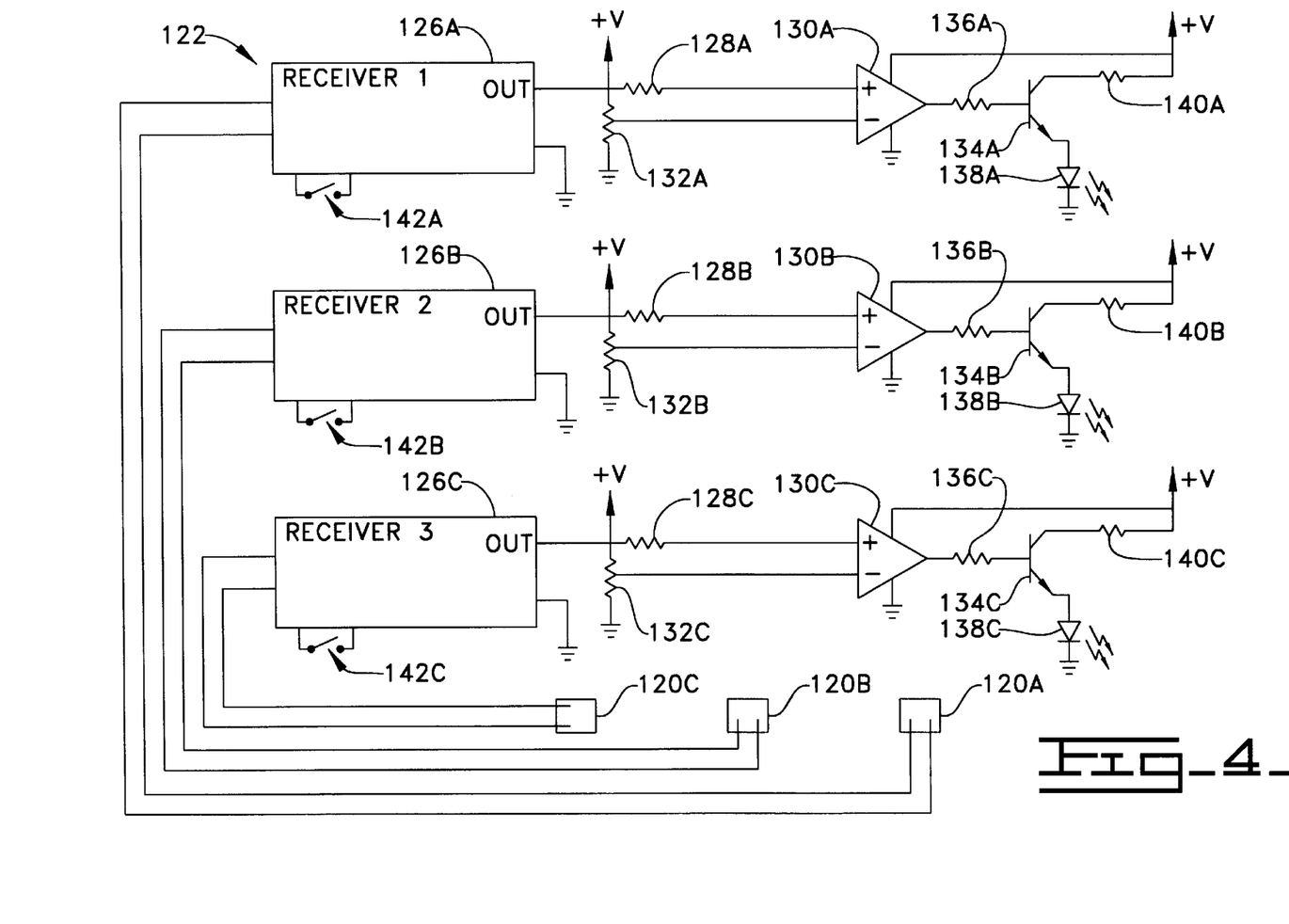
FIG. 4 is a schematic illustration of the signal receiving device of the present invention.

Signal receiving unit 122 is utilized to monitor the signals induced in pickup coils 120A, 120B, and 120C and to allow properly wired injector pairs to be distinguished from cross-wired injector pairs. In particular, as shown in FIG. 4 each pickup coil 120A, 120B, 120C is connected to a respective RF signal receiver 126A, 126B, 126C. Such receivers 126A, 126B, 126C may, for example, be Progressive Electronics, Inc. model 508 type receivers. The pickup coils 120A, 120B, 120C may be solenoid-type pickup coils also available from Progressive Electronic, Inc.

Like circuits are shown with respect to each receiver 126A, 126B, 126C and it is understood that the discussion herein with reference to receiver 126A applies to receivers 126B and 126C as well. The output of receiver 126A is connected through a resistor 128A to the non-inverting input of a comparator 130A. The inverting input of comparator 130A is connected through a variable resistor 132A to an electrical energy source +V for establishing a threshold voltage level. An output of comparator 130A is connected to a control input of switching transistor 134A through resistor 136A, and transistor 134A is connected in series with an LED 138A or other output indicator device. The output of comparator 130A controls the ON/OFF state of transistor 134A, and the ON/OFF state of transistor 134A controls whether electrical energy is delivered through resistor 140A to LED 138A. Receiver 126A also includes an ON/OFF switch 142A associated therewith.

In operation, a signal induced in pickup coil 120A is passed to receiver 126A and receiver 126A produces an output signal corresponding thereto. When the voltage level of the output signal exceeds the threshold voltage level established through variable resistor 132A the output of comparator 130A goes high and transistor 134A is turned ON such that electrical energy is delivered to LED 138A. If the voltage level of the output signal of receiver 126A is below the threshold voltage level then the output of comparator 130A is low and transistor 134A is placed in an OFF state such that no electrical energy is delivered thereto. The threshold voltage level can be varied as necessary by adjusting variable resistor 132A.

INDUSTRIAL APPLICABILITY

The system 110 of the present invention provides a relatively simple technique for determining whether an EUI 102 is properly wired and, in particular for determining whether the EUIs of a given pair of adjacent EUIs are cross-wired. Use of a low frequency test signal, such as an RF signal, is particularly preferred in applications where engine valve cover 108 is formed of a non-ferrous metal such as aluminum because low frequency electromagnetic waves more readily pass through a non-ferrous metal for detection by pickup coils 120A, 120B, 120C. Of course, the frequency of the test signal could be adjusted as necessary. If the engine is properly wired, when a test signal is applied to the predetermined wiring harness connection locations, a signal should be induced in each of pickup coils 120A, 120B, and 120C which is strong enough to result in delivery of electrical energy to each LED 138A, 138B, 138C which, accordingly lights up, and acts as a good connection output indicator. The different LEDs 138A, 138B, 138C can be observed to determine if a cross-wiring problem exists. If there is a cross-wiring problem the LED associated with the cross-wired pair of injectors will not light up during testing and the EUI system can be checked and re-wired as necessary before the engine 100 is ever operated.

It is important to note that the illustrated system 110 allows the wiring of all pairs of EUIs of the engine to be checked for cross-wiring simultaneously. This simultaneous cross-wire testing would not be possible in a system where the test signal generator is connected to deliver test signals to all of the EUIs. In the illustrated system 110, signal generator 118 is only connected to deliver test signals to one EUI of each pair of EUIs.

Figure 5:
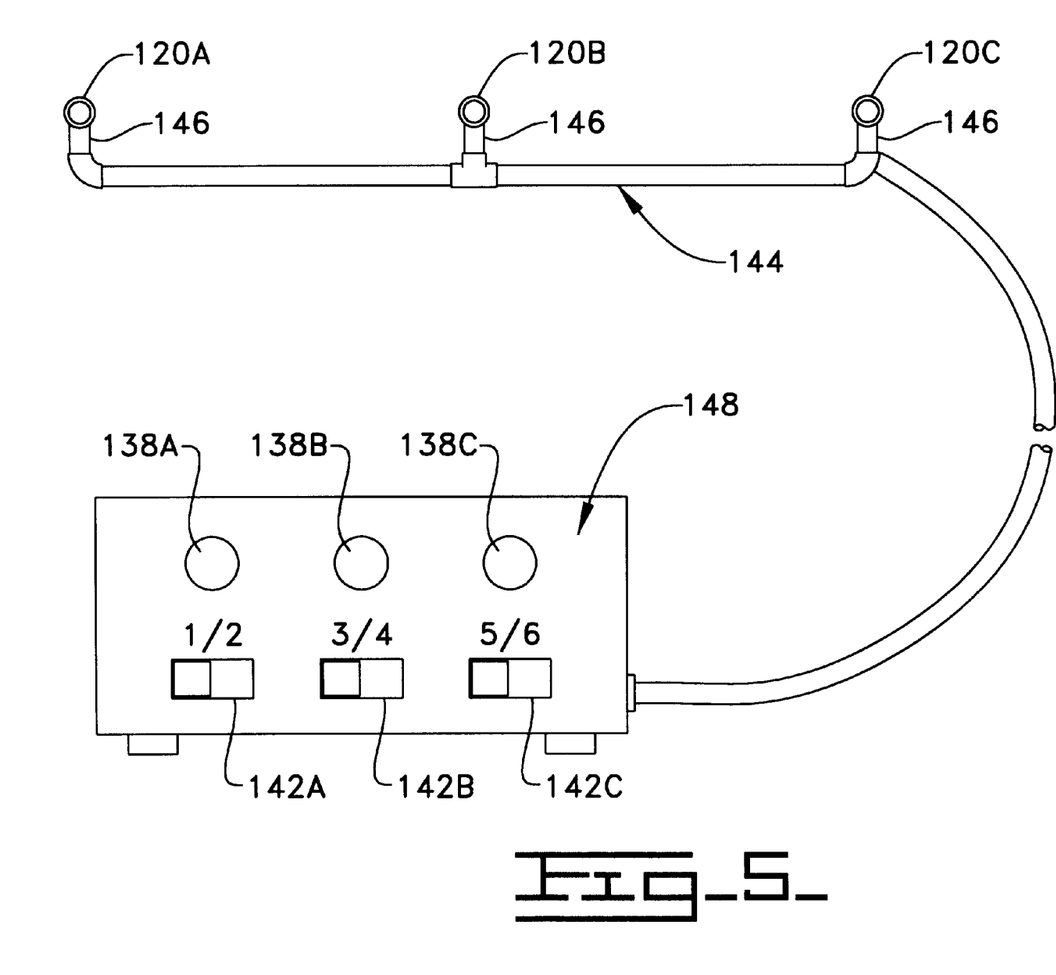
FIG. 5 is an illustration of a pickup coil holding structure and a display.

In terms of pickup coils 120A, 120B, 120C, it is preferred that such coils be positioned in a pickup coil holding structure which is configured to hold the coils in a predetermined spaced relationship which allows them to be positioned adjacent the engine valve cover 108 at the desired predetermined locations. For example, reference is made to FIG. 5 which shows a pickup coil holding structure 144 constructed of PVC pipe. Each pickup coil 120A, 120B, and 120C is positioned at the end of one leg or arm 146 of the holding structure 144. The wiring of each coil can be easily fed through the PVC pipe holding structure 144 for connection to the signal receiving circuit which includes each signal receiver 126A, 126B, 126C and its associated circuitry. Of course, pickup coil holding structure could be formed of many other materials and could take on a variety of configurations as necessary to match the positioning of the pickup coils to the configuration of a given engine valve cover. It is anticipated that all LEDs 138A, 138B, 138C will be positioned at a central location of the receiving unit for easy observation by a test system operator. Accordingly, a representative display 148 depicts the LEDs 138A, 138B, 138C and corresponding EUI pair identifications associated therewith so that the test system operator can designate which pair of EUIs needs to be re-wired, if any.

Although in the illustrated embodiment LEDs are utilized as output indicators, it is recognized that other output devices could be utilized, including other visual output devices as well as audio output devices. Visual output devices may be preferred in high noise level environments such as manufacturing environments.

Other aspects, objects and advantages of the present invention can be obtained from a study of the drawings, the disclosure and the appended claims.

What is claimed is:

1. A diagnostic system for detecting cross-wiring between first and second electronic unit injectors of an internal combustion engine, the engine including a wiring harness having a connector which includes a first interface point identified for delivering signals to the first electronic unit injector, a second interface point identified for delivering signals to the second electronic unit injector, a third interface point identified for providing a return path for signals delivered to the first electronic unit injector, and a fourth interface point identified for providing a return path for signals delivered to the second electronic unit injector, the first and second electronic unit injectors being enclosed within a cover of the engine and the wiring harness connector being accessible from the exterior of the engine cover, the diagnostic system comprising:

a signal generator including a signal high line and a signal low line;

a connector configured for mating with the wiring harness connector, the connector including a first predetermined interface point for mating with the first interface point of the wiring harness connector, a second predetermined interface point for mating with the second interface point of the wiring harness connector, a third predetermined interface point for mating with the third interface point of the wiring harness connector, and a fourth predetermined interface point for mating with the fourth interface point of the wiring harness connector, the signal high line of the signal generator electrically connected to the first predetermined interface point of the connector, and the signal low line of the signal generator electrically connected to at least the third predetermined interface point of the connector;

a pickup coil adapted for placement adjacent to the engine cover in a region associated with the first electronic unit injector; and a signal receiving unit electrically connected to the pickup coil for receiving signals therefrom, the signal receiving unit including a comparator portion and an output device, the comparator portion including an output connected to control the output device, the output device producing a visible output when a parameter of a signal received from the pickup coil exceeds a threshold level.

2. The diagnostic system, as set forth in claim 1, wherein the signal generator is an RF signal generator.

3. The diagnostic system, as set forth in claim 2, wherein the signal receiving unit includes an RF signal receiver having an input electrically connected to receive signals from the pickup coil and an output electrically connected to a first input of the comparator portion, the comparator portion having a second input connected to an electrical energy source which establishes a threshold voltage level, the comparator portion comparing the established threshold voltage level to the voltage level at the output of the RF signal receiver.

4. The diagnostic system, as set forth in claim 3, wherein the second input of the comparator portion of the signal receiving unit is connected to the electrical energy source through a variable resistor such that the threshold voltage level is adjustable.

5. The diagnostic system, as set forth in claim 4, wherein the output of the comparator portion of the signal receiving unit is connected to a control input of a transistor, the transistor being connected in series with the output device, the ON/OFF state of the transistor establishing whether electrical energy is delivered to the output device.

6. An electronic unit injector cross-wire detection system for an internal combustion engine including at least two pairs of electronic unit injectors, each pair of electronic unit injectors comprising a respective first electronic unit injector and a respective second electronic unit injector, each of the electronic unit injectors enclosed within a cover of the engine at respective predetermined positions, the engine including a wiring harness, the wiring harness including, for each pair of electronic unit injectors, a first connection location identified for delivering signals to the first electronic unit injector of the given pair and a second connection location identified for returning signals delivered to the first electronic unit injector of the given pair, each of the first and second wiring harness connection locations being accessible from the exterior of the engine cover, the cross-wire detection system comprising:

a test signal generating device including a signal high line and a signal low line, the signal high line connected to the first wiring harness connection location of each pair of electronic unit injectors, the signal low line connected to the second wiring harness connection location of each pair of electronic unit injectors; and a signal receiving device including at least two pickup coils, a pickup coil holding structure, and a signal monitoring unit, the two pickup coils held in a predetermined spaced relationship by the pickup coil holding structure such that each pickup coil is positioned adjacent to a respective predetermined portion of the engine cover, each respective predetermined portion of the engine cover being proximate to the first electronic unit injector of a respective pair of electronic unit injectors enclosed within the engine cover, the signal monitoring unit connected to each of the pickup coils.

7. The cross-wire detection system, as set forth in claim 6, wherein the signal generator comprises an RF signal generator, and wherein the signal monitoring unit includes at least two signal monitoring circuits, each signal monitoring circuit including an RF signal receiver having an output connected to a first input of a comparator, each RF signal receiver having an input connected to a respective pickup coil.

8. The cross-wire detection system, as set forth in claim 7, wherein the comparator of each signal monitoring circuit includes a second input connected to an electrical energy source through a variable resistor, and wherein the comparator of each signal monitoring circuit includes an output connected to a control input of a transistor, the transistor of each signal monitoring circuit connected in series with an output device.

9. The cross-wire detection system, as set forth in claim 8, wherein the output device of each signal monitoring circuit comprises a visual output device, each visual output device located at a central location of the signal monitoring unit.

10. A method for determining whether an electronic unit injector enclosed within a non-ferrous metal cover of an internal combustion engine is properly connected to a wiring harness, the wiring harness including a predetermined connection point identified for delivering signals to the electronic unit injector, the predetermined connection point accessible from the exterior of the non-ferrous metal cover, a predetermined location of the exterior of the non-ferrous metal cover being proximate to the electronic unit injector enclosed therein, the method comprising:

connecting a signal generator to the predetermined connection point of the wiring harness;

placing a pickup coil adjacent to the predetermined location of the non-ferrous metal cover;

applying a low frequency test signal to the predetermined connection point of the wiring harness via the signal generator;

monitoring the pickup coil to determine if a signal indicative of the electronic unit injector being properly connected to the wiring harness is induced in the pickup coil; and producing an output indicator if a signal indicative of the electronic unit injector being properly connected to the wiring harness is induced in the pickup coil.

11. The method, as set forth in claim 10, wherein the signal generator is an RF signal generator and the applied low frequency signal is an RF signal, and wherein the monitoring of the pickup coil involves applying a signal induced therein to an RF signal receiver, establishing an output signal from the RF signal receiver, and comparing a voltage level of the output signal of the RF signal receiver to a threshold voltage level.

12. The method, as set forth in claim 11, wherein the output indicator is produced when the voltage level of the output signal of the RF signal receiver exceeds the threshold voltage level.

13. The method, as set forth in claim 12, wherein the output indicator is a visible signal.

14. A method for detecting cross-wiring errors in an internal combustion engine including at least two pairs of electronic unit injectors enclosed within a cover of the engine, each pair of electronic unit injectors comprising a respective first electronic unit injector and a respective second electronic unit injector, the engine including a wiring harness, the wiring harness including, for each pair of electronic unit injectors, a first connection location identified for delivering signals to the first electronic unit injector of the given pair, the first electronic unit injector of each pair being located at a respective predetermined location within the engine cover, the method comprising:

(a) performing the following operations for each pair of electronic unit injectors:

(i) applying a test signal to the predetermined connection location of the wiring harness for the pair under test;

(ii) positioning a pickup coil adjacent an exterior of the engine cover proximate to the redetermined location therewithin associated with the first electronic unit injector of the pair under test;

(iii) monitoring the pickup coil to determine if a signal indicative of the electronic unit injector being properly connected to the wiring harness is induced therein; and (iv) producing an output indicator if a signal indicative of the electronic unit injector being properly connected to the wiring harness is detected in (iii).

15. The method, as set forth in claim 14, wherein the operations (a)(i) through (a)(iv) are performed simultaneously for each pair of electronic unit injectors.

16. The method, as set forth in claim 15, wherein the output indicator produced in (iv) is a visible signal.

* * * * *